(12) United States Patent
Kuriyama et al.

(10) Patent No.: US 6,501,178 B1
(45) Date of Patent: *Dec. 31, 2002

(54) SEMICONDUCTOR DEVICE

(75) Inventors: Hirotada Kuriyama, Tokyo (JP); Kazuhito Tsutsumi, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 834 days.

(21) Appl. No.: 08/795,176

(22) Filed: Feb. 4, 1997

(30) Foreign Application Priority Data

Aug. 27, 1996 (JP) .............................. 8-225421

(51) Int. Cl.⁷ ..................... H01L 23/48; H01L 23/52; H01L 29/40; H01L 27/11
(52) U.S. Cl. .................... 257/758; 257/750; 257/903
(58) Field of Search .................. 257/7.58, 67, 773–774, 257/760, 393, 903, 904, 758; 438/355, 637, 701, 978, 152, 906

(56) References Cited

U.S. PATENT DOCUMENTS

| | | | | |
|---|---|---|---|---|
| 4,874,719 A | * | 10/1989 | Kurosawa | 438/637 |
| 5,258,329 A | * | 11/1993 | Shibata | 438/637 |
| 5,327,003 A | * | 7/1994 | Itabashi et al. | 257/903 |
| 5,381,046 A | | 1/1995 | Cederbaum et al. | |
| 5,426,324 A | | 6/1995 | Rajeevakumar | |
| 5,439,848 A | * | 8/1995 | Sheng | 438/637 |
| 5,535,155 A | * | 7/1996 | Abe | 257/903 |
| 5,545,584 A | | 8/1996 | Wuu et al. | |
| 5,571,751 A | * | 11/1996 | Chung | 438/637 |
| 5,576,243 A | * | 11/1996 | Wuu | 438/637 |
| 5,591,673 A | * | 1/1997 | Chao | 438/637 |
| 5,684,331 A | * | 11/1997 | Jun | 257/773 |
| 5,686,736 A | * | 11/1997 | Natsume | 257/903 |
| 5,714,778 A | * | 2/1998 | Yamazaki | 257/773 |
| 5,780,909 A | * | 7/1998 | Hayashi | 257/393 |

FOREIGN PATENT DOCUMENTS

| | | | | |
|---|---|---|---|---|
| JP | 63-193558 | | 8/1988 | |
| JP | 63-260054 | | 10/1988 | |
| JP | 01/264254 A | * | 10/1989 | 438/426 |
| JP | 4-144281 | | 5/1992 | |
| JP | 6-5820 | | 1/1994 | |
| JP | 7-202032 | | 8/1995 | |
| JP | 7-321233 | | 12/1995 | |

OTHER PUBLICATIONS

Itabashi, Kazuo, et al: "A Split Wordline Cell for 16Mb SRAM Using Polysilicon Sidewall Contacts", *IEEE Technical Digest*, Dec. 1991, pp. 477–480.

Ohkubo, H., et al: "16Mbit SRAM Cell Technologies for 2.0V Operation", *IEEE Technical Digest*, Dec. 1991, pp. 481–483.

* cited by examiner

Primary Examiner—Cuong Quang Nguyen
(74) Attorney, Agent, or Firm—McDermott, Wil, & Emery

(57) ABSTRACT

In a semiconductor device, a first conductive layer (2) is located on a semiconductor substrate (14) through an insulating film (13a) and beneath a first insulating layer (13f). On the first insulating layer (13f) is formed a second conductive layer (8) followed by a second insulating layer (13g), either or both of which are very thin. A third conductive layer (6) is placed on the second insulating layer (13g). A connecting column (16) extends from the third conducting layer (6) through and forming an end contact with the second conductive layer (8) to the first conducting layer (2) and the substrate (14), with a greater portion of the column resting upon the substrate (14). The third conductive layer (6) forms the gate electrode (6b) of a top gate type TFT.

20 Claims, 11 Drawing Sheets

US 6,501,178 B1

SEMICONDUCTOR DEVICE

BACKGROUND OF THE INVENTION

1. Technical Field

The present invention relates to a semiconductor device in which a structure for providing electrical connections among a plurality of conductive films has been improved.

2. Background Art

A structure for providing electrical connections among a plurality of conductive layers or films employed in a conventional semiconductor device will first be explained by a SRAM as an illustrative example. In general, a memory cell in the SRAM is composed of six elements in total, which include four elements of N type access transistors Q1 and Q2 and driver transistors Q3 and Q4 and two elements of P type load transistors Q5 and Q6 as shown in FIG. 10. However, in this case, the memory cell increases in size, because the six elements are formed on a substrate. To cope with this situation, the size of the memory cell was reduced by using TFTs as the two P type transistors, forming the four N type elements on the substrate and forming the two P type TFT on the N type elements. As this example, a memory cell is known which has been described in, for example, a Technical Digest "International Electron Devices Meeting 1991", p. 481–484.

FIGS. 11 through 13 show memory cell patterns of such a SRAM. FIG. 11 shows the layout of active layers 1a and 1b, an element separation region 12, first polysilicon films 2a through 2d and a second polysilicon film 4 all formed on a semiconductor substrate. Further, shown in FIG. 11 are a first polycontact 3a for connecting the active layer 1b and the first polysilicon film 2c to each other, a first polycontact 3b for connecting the active layer 1a and the first polysilicon film 2d to each other and second polycontacts 5a and 5b for respectively connecting the active layers 1a and 1b to the second polysilicon film 4.

FIG. 12 shows the layout of third polysilicon films 6a and 6b and fourth polysilicon films 8a and 8b. Further, shown in FIG. 12 are a third polycontact 7a for connecting a first polysilicon film 2c and a third polysilicon film 6b to each other, a third polycontact 7b for connecting a first polysilicon film 2d and a third polysilicon film 6a to one another, a fourth polycontact 9a for connecting the third polysilicon film 6b and a fourth polysilicon film 8a to each other, and a fourth polycontact 9b for connecting the third polysilicon film 6a and the fourth polysilicon film 8a to each other.

FIG. 13 shows the layout of metal patterns or interconnections 11a and 11b. Further, shown in FIG. 13 are a metal contact 10a for connecting an active layer 1a and the metal interconnection 11a to one another and a metal contact 10b for connecting an active layer 1b and the metal interconnection 11b to one another.

In these drawings, each of the first polysilicon films 2a through 2d is formed as a gate electrode of a substrate transistor. The second polysilicon film 4 is formed as a GND pattern or interconnection for each memory cell. Each of the third polysilicon films 6a and 6b is formed as a gate electrode of a TFT. Each of the fourth polysilicon films 8a and 8b is formed as a source/drain and channel layer of a TFT. Finally, each of the metal interconnections 11a and 11b is formed as a bit line.

FIG. 14 is a sectional structural view taken along line A–A' of FIGS. 11 to 13. In the drawing, the same reference numerals as those shown in FIGS. 11 through 13 respectively indicate the same elements of structure as those shown in FIGS. 11 to 13.

Referring also to FIG. 14, the memory cell includes a gate oxide film 13a of a bulk transistor, inter-layer insulating films 13b, 13c and 13e, and a gate oxide film 13d of a TFT. Incidentally, the first polysilicon films 2a through 2d and the second polysilicon film 4 may be polysilicide composed of a combination of polysilicon and a silicide layer without being composed of a single polysilicon layer alone.

A tandem contact structure formed by connecting the first polycontact 3b, the third polycontact 7b and the fourth polycontact 9b among the polycontacts illustrated in FIGS. 11 to 13 is understood as viewed from FIG. 14.

The conventional SRAM cell formed in this way has the following problems.

(1) The many polycontacts such as the first through fourth polycontacts 3a, 3b, 5a, 5b, 7a, 7b, 9a and 9b are required to make contact to respective polysilicon layers. Therefore, a number of polycontact masks, frequent photoengraving and etching process for polycontacts are required, resulting in complex processes.

(2) A method of reducing the number of the polycontact masks, called shared contact structures, is known. FIG. 15 shows a sectional structure thereof. A third polysilicon film 6 provides a polycontact simultaneously with respect to an active layer 1 and a first polysilicon film 2 for forming a gate electrode of a transistor. Thus, a first polycontact becomes unnecessary by forming a third polycontact in a shared structure, so that the number of polycontacts can be reduced by one. In each symmetrical cell of the conventional SRAM, however, the two third polycontacts are necessary within the cell because of its symmetry. Since the shared contact is connected to the two layers (active layer 1 and first polysilicon film 2 in the conventional example), it is necessary to increase the size of the shared contact as compared with that of the normal polycontact from the viewpoint of the need for reliable electrical connection of the shared contact to the respective layers. As a result, a problem arises because the cell size increases.

(3) Further, as examples of a TFT, a bottom gate type TFT in which a gate electrode is provided below a polysilicon film for forming source/drain (S/D) and channel regions, and a top gate type TFT in which a gate electrode is provided above a polysilicon film for forming source/drain (S/D) and channel regions, are known. The cells shown in FIGS. 11 through 14 respectively use the bottom gate type TFT. In general, the top gate type TFT is superior in performance to the bottom gate type TFT. When the top gate type TFT and the shared direct contact structure are adopted, the polysilicon film for the P type source/drain (S/D) region of the TFT is brought into contact with an N type active layer. In general, the connection of an N type active layer to a P type polysilicon film is apt to form a PN junction as compared with an N type polysilicon to the P type polysilicon film. If the PN junction is formed, then a adverse effect is exerted on the operation of each cell. It was therefore difficult to combine the shared direct contact and the top gate type TFT into one. The present invention has been provided to solve the conventional problems referred to above.

SUMMARY OF THE INVENTION

According to one aspect of the present invention, a semiconductor device comprises a first conductive film formed on a semiconductor substrate, a second conductive film formed on the first conductive film with a first insulating film interposed between them, a third conductive film formed on the second conductive film with a second insulating film interposed between them. And a columnar connecting portion penetrates at least the second insulating film and the first insulating film from the third conductive film so as to reach the first conductive film and the semiconductor substrate. The second conductive film is brought into contact with the columnar connecting portion at its end surface, and the thickness of the second conductive film is less than that of the third conductive film.

According to another aspect of the present invention, a semiconductor device comprises a first conductive film formed on a semiconductor substrate, a second conductive film formed on the first conductive film with a first insulating film interposed between them, a third conductive film formed on the second conductive film with a second insulating film interposed between them. And a columnar connecting portion penetrates at least the second insulating film and the first insulating film from the third conductive film so as to reach the first conductive film and the semiconductor substrate. The second conductive film is brought into contact with the columnar connecting portion at its end surface, and the thickness of the second insulating film is less than that of the first insulating film.

In another aspect of the present invention, in the semiconductor device, an end of the first conductive film extends toward the columnar connecting portion, and the length of the extended end is equal to or less than one-half the diameter of the columnar connecting portion.

In another aspect of the present invention, in the semiconductor device, the first conductive film is brought into contact with the columnar connecting portion at its end surface.

In another aspect of the present invention, in the semiconductor device, a third insulating film is formed between the semiconductor substrate and the first conductive film. The first conductive film is formed as a gate electrode of a substrate transistor. The second conductive film is formed as a channel conductive layer of a TFT transistor, and the third conductive film is formed as a gate electrode of the TFT transistor.

In another aspect of the present invention, in the semiconductor device, the semiconductor substrate has an N type active layer. And the third conductive film and the columnar connecting portion in contact with the N type active layer are formed of N type polysilicon.

Other features and advantages of the present invention will become more apparent from the following description taken together with the accompanying drawings.

DETAILED DESCRIPTION OF THE PREFERRED EMBODIMENTS

This invention will be described in further detail by way of example with reference to the accompanying drawings.

First Embodiment

Figure 1:
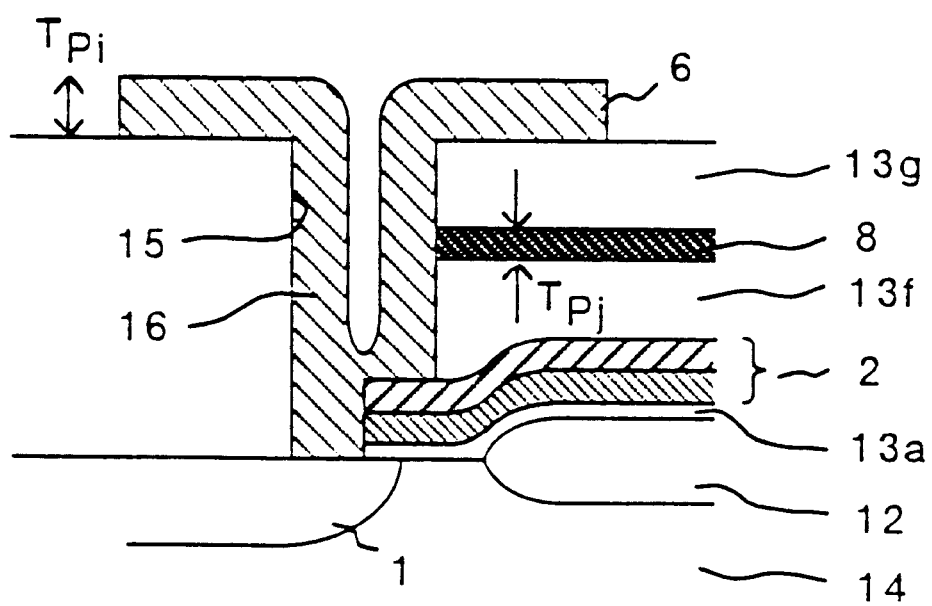
FIG. 1 is a sectional structural view showing an interlayer connection structure of a semiconductor device according to a first embodiment of the present invention.

FIG. 1 is a cross-sectional view showing an interlayer connection structure, i.e., a shared contact structure employed in a semiconductor device according to a first embodiment of the present invention. In the drawing, the contact structure includes a silicon substrate 14, an N type active layer 1 of the silicon substrate, an oxide film 12 as an element separation region, a gate oxide film 13a serving as a third insulating film, a first polysilicon film 2 serving as a first conductive film, an interlayer insulating film 13f serving as a first insulating film, a second polysilicon film 8 serving as a second conductive film, an interlayer insulating film 13g serving as a second insulating film, and a third polysilicon film 6 serving as a third conductive film.

Further, the contact structure includes a hole 15 and a connecting portion 16 which protrudes from the third polysilicon film 6 so as to fill the hole 15.

The hole 15 penetrates the second insulating film 13g, the second polysilicon film 8 and the first insulating film 13f. Further, the hole 15 passes through the first polysilicon film 2 and the third insulating film 13a so as to reach the active layer 1 of the silicon substrate 14. The columnar connecting portion 16, which extends from the third polysilicon film 6, fills up the hole 15 and is brought into conduction in contact with the active layer 1, the first polysilicon film 2 and the second polysilicon film 8.

Figure 5:
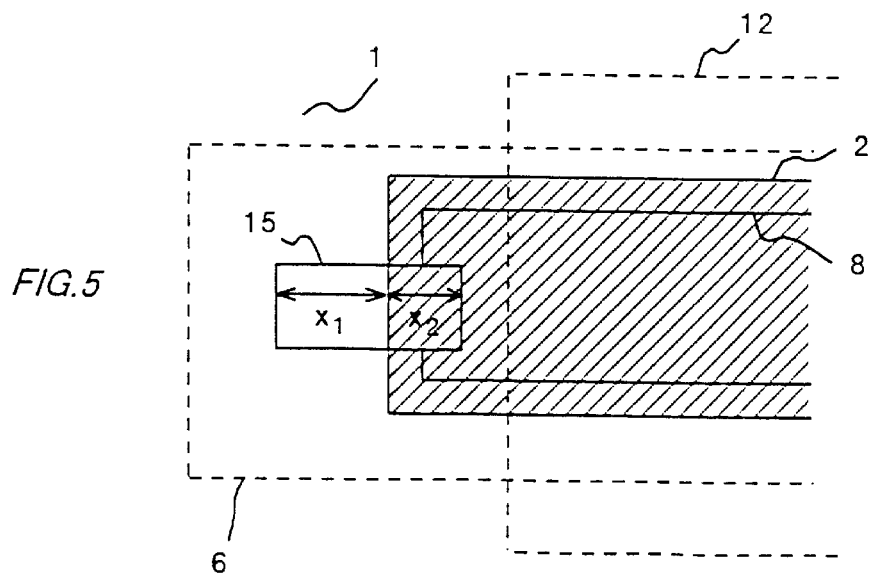
FIG. 5 is a top plan view illustrating an interlayer connection structure of a semiconductor device according to a fourth embodiment of the present invention.

Although described in detail later, FIG. 5 is a plan view showing a shared contact structure of the present invention. A plan view of the shared contact structure shown in FIG. 1 is shown in a manner similar to FIG. 5. Thus, it can be understood how a hole 15 penetrates a second conductive film 8 so as to cut out a portion of the leading end of the second conductive film 8 and encompasses the portion of the leading end of the first conductive film 2.

Further, in the first embodiment, consideration has been given to the relationship between the thickness of the third polysilicon film 6 and that of the second polysilicon film 8

(the polysilicon film is often abbreviated as "poly" below for simplicity of illustration). Namely, when the thickness of the third poly 6 is set as Tpi and the thickness of the second poly 8 is set as Tpj, then Tpi>Tpj. The thickness Tpj of the second poly 8 may preferably be equal to or less than one-half the thickness Tpi of the third poly 6. Described specifically, preferably, Tpi ranges from 100 nm to 200 nm and Tpj is equal to or less than 50 nm. When the second poly 8 and the third poly 6 are used as conductive lead, the lower resistance layer is used for the third poly 6. Therefore, the third poly 6 is thicker than the second poly 8 in thickness.

Figure 2A:
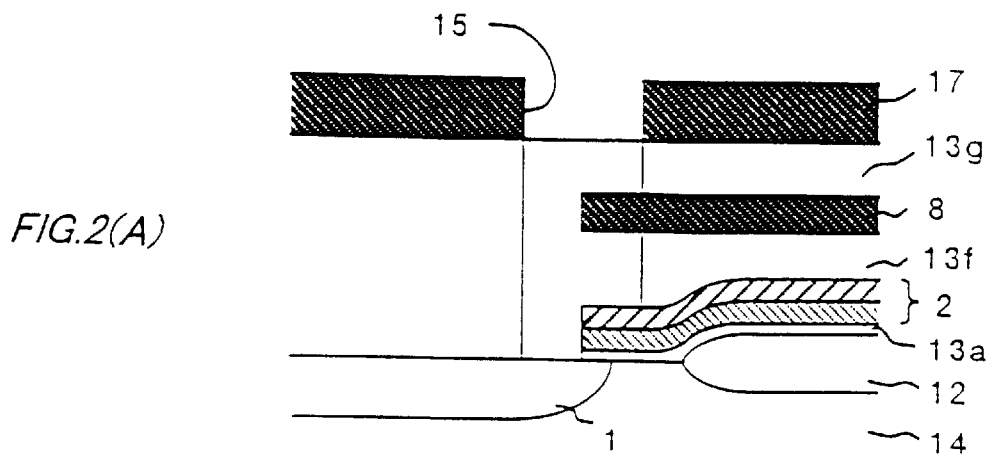
FIGS. 2A, 2B, and 2C are a sectional structural view illustrating a method of fabricating the semiconductor device according to the first embodiment of the present invention.
Figure 2B:
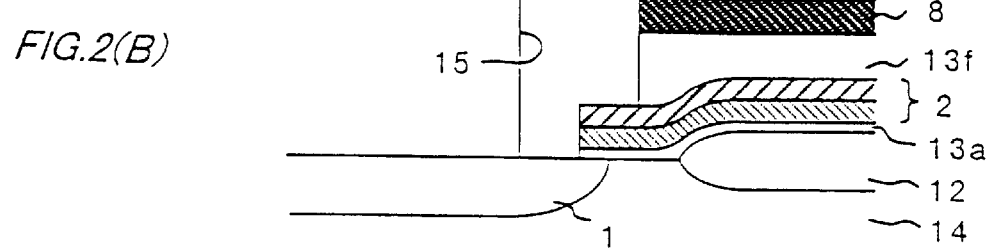
Figure 2C:
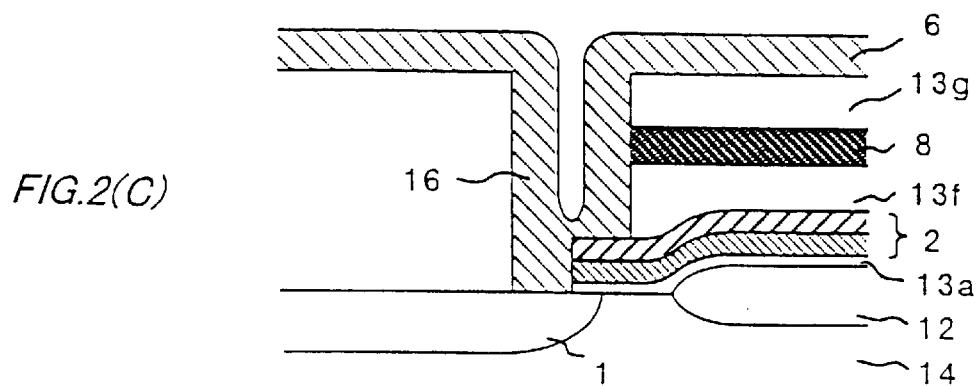

A method of forming a shared contact structure of the present embodiment will next be described. FIGS. 2(A) through 2(C) show the process of forming the structure. As shown in FIG. 2(A), an element separation region 12, an oxide film 13a, a first poly 2, an interlayer insulating film 13f, a second poly 8 and an interlayer insulating film 13g are first formed on a silicon substrate 14. Thereafter, a photo-engraving process for forming a polycontact is performed, and a resist 17 is subjected to patterning so as to define a hole 15.

Subsequently, an aperture 15 for providing a polycontact is formed by dry etching as shown in FIG. 2(B). The second poly 8 in the aperture 15 is removed by this etching. The resist 17 is removed after the etching.

Next, the third poly 6 is deposited as shown in FIG. 2(C) to form the connecting portion 16 which extends in a columnar form. As a result, the active layer 1, the first poly 2 and the second poly 8 are connected to each other. At this time, the second poly 8 is connected to the third poly 6 at an end surface (i.e., at a side wall) of the leading end thereof.

Conventionally, three kinds of polycontacts or two kinds of shared contacts were required to connect three poly layers to one another. However, by adopting the structure according to the present embodiment, the type of polycontact can be limited to one, so that the number of masks can be reduced. Since the photoengraving process may be done once, process steps can be simplified.

In the present embodiment as described above, assuming that the thickness of the third poly is defined as Tpi and the thickness of the second poly is defined as Tpj, then Tpi>Tpj. Described specifically, Tpi may preferably range from 100 nm to 200 nm, whereas Tpj may preferably be equal to or less than 50 nm. Thus, the contact etching becomes easy as compared with the conventional one. This will be described below.

In the normal dry etching, the polysilicon is resistant to etching upon oxide-film etching, whereas the oxide film becomes resistant to etching upon polysilicon etching. Therefore, etching is required in three stages to realize the contact etching shown in FIG. 2(B). Namely, the first stage corresponds to oxide-film etching of the inter layer insulating film 13g, the second stage corresponds to polyetching of the second polysilicon film 8, and the third stage.corresponds to oxide-film etching of an inter layer insulating film 13f. Therefore, an etching process becomes complex.

However, since the thickness Tpj of the second poly 8 is rendered thin, desirably, very thin in the present embodiment, the polycontact-providing aperture can be formed by the one-stage etching. An etching method is executed by the oxide-film etching alone. Namely, the second poly 8 is etched after etching of the second inter layer insulating film 13g. However, since the poly thickness is thin, the etching method can be executed by an oxide-film etching process. In the shared contact structure according to the present embodiment as described above, the etching process becomes easy by making the second poly 8 thin.

Further, since the third poly 6 is provided as the top layer, the third poly 6 can be also formed into a thick poly layer regardless of etching.

Second Embodiment

Figure 3:
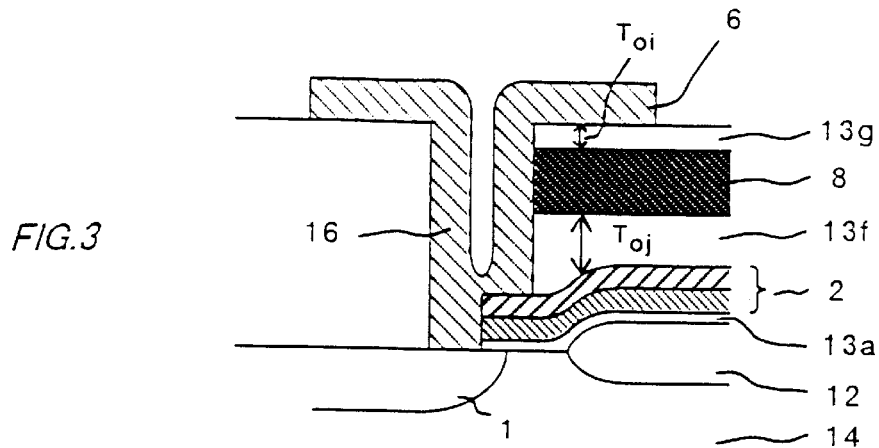
FIG. 3 is a sectional structural view depicting an interlayer connection structure of a semiconductor device according to a second embodiment of the present invention.

FIG. 3 is a cross-sectional view showing a shared contact employed in a semiconductor device according to another embodiment of the present invention. In the drawing, the same reference numerals as those shown in FIGS. 1 and 2 indicate the same or corresponding elements of structure as those shown in FIGS. 1 and 2, and the description of their respective portions will be omitted to avoid their repetition.

In the present embodiment, consideration has been given to the relationship in thickness between a first inter layer insulating film 13f and a second inter layer insulating film 13g. If the thickness of the first inter layer insulating film 13f is defined as Toj and the thickness of the second inter layer insulating film 13g is defined as Toi, then Toj>>Toi. The thickness Toi of the second inter layer insulating film 13g may preferably be equal to or less than one-tenth the thickness Toj of the first inter layer insulating film 13f.

Thus, even in the case of the shared contact structure according to the present embodiment, contact etching becomes easy as compared with the conventional example. The conventionally-used three-stage etching can be replaced with two-stage etching.

In this two-stage etching method, the second interlayer insulating film 13g and a second poly 8 are subjected to a polyetching process in the first stage. Since the second interlayer insulating film 13g is thin even in this case, an aperture can be formed by the polyetching process. Thus, the etching process can be easily carried out by making the thickness Toi of the second inter layer insulating film 13g less than or preferably much thinner than that Toj of the first interlayer insulating film 13f.

Third Embodiment

Figure 4:
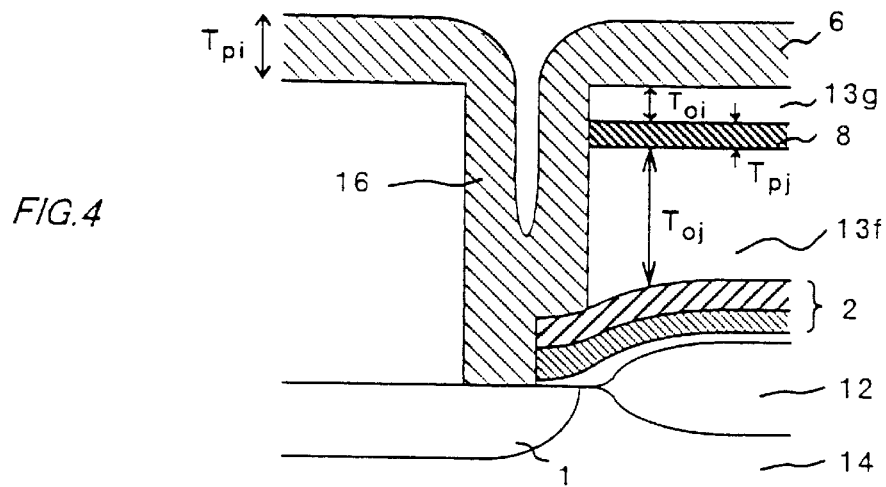
FIG. 4 is a sectional structural view showing an interlayer connection structure of a semiconductor device according to a third embodiment of the present invention.

FIG. 4 is a cross-sectional view showing a shared contact structure of a semiconductor device according to a further embodiment of the present invention. In the drawing, the same reference numerals as those shown in FIGS. 1 to 3 respectively indicate the same or corresponding elements of structure as those shown in FIGS. 1 to 3, and a detailed description of the respective portions will be omitted.

Even in this type of shared contact structure, an N type active layer 1, a first poly 2 and a second poly 8 are connected to one another by a third poly 6. The present embodiment is a combination of characteristic features of the first and second embodiments.

Namely, the thickness Tpj of the second poly 8 is set so as to become thinner than the thickness Tpi of the third poly 6 (Tpi>Tpj). Also, the thickness Toi of a second inter layer insulating film 13g is set so as to be less than the thickness Toj of a first interlayer insulating film 13f (Toj>>Toi). This means that the thickness Tpj of the second poly 8 and the thickness Toi of the second insulating film 13g are made extremely small in practice (Tpi, Toj>>Tpj, Toi).

Owing to the provision of such a structure, an aperture for providing a polycontact can be formed by either of the first-stage etching and second-stage etching described in the first and second embodiments. Therefore, the number of etching process steps can be reduced. Further, an etching method can be selected according to the provision of an etching device.

Fourth Embodiment

FIG. 5 shows a shared contact structure of a semiconductor device according to a still further embodiment of the present invention. FIG. 5 is a view as seen from the top to indicate a plane configuration of the shared contact structure.

In the drawing, the same reference numerals as those shown in FIGS. 1 to 4 respectively indicate the same or corresponding portions as those shown in FIGS. 1 to 4.

In the shared contact structure according to the present embodiment as shown in FIG. 5, a columnar connecting portion 16 extending from a third poly 6 is located at the leading end portions of a first poly 2 and a second poly 8. A part (corresponding to the portion indicated by a length x1 in the drawing) of the connecting portion 16 is brought into direct contact with an active layer 1. A part (corresponding to the portion indicated by a length x2 in the drawing) of the connecting portion 16 on the other side of it cuts out a part of the leading end of the second poly 8 so as to penetrate the second poly 8, whereby the part is brought into contact with the first poly 2. The second poly 8 makes contact with the connecting portion 16 through the three sides of the end surface (side surface) of the cut-out part thereof so as to make conduction or continuity between the second poly 8 and the connecting portion 16. The first poly 2 makes contact with the connecting portion 16 at an upper surface and an end surface (side surface) of the leading end having a shape extending into the connecting portion 16 so as to make conduction between them.

In the shared contact formed in this way, consideration has been given to an area (corresponding to a portion indicated by the length x1 in the drawing) of the connecting portion 16, which makes contact with the active layer 1 and an area (corresponding to a portion indicated by the length x2 in the drawing) of the connecting portion 16, which makes contact with the first poly 2. Namely, a width X1 of a portion of the active layer 1 is set so as to be greater than a width X2 of a portion of the first poly 2 in regard to a size assignment for the contact (i.e. X1>X2).

In other words, the leading end of the first poly 2 protrudes into the connecting portion 16, but the length of the extended leading end is reduced so as to be less than one-half the horizontally-extending length of the connecting portion 16. Namely, the protruded leading end of it is made smaller than one-half the diameter of the connecting portion 16.

The following problems can be solved owing to the formation of such a structure.

In the shared contact structure according to the present invention, the polysilicon film and the interlayer insulating film are respectively increased by one layer compared with a conventional structure, and the contact is formed deep. When the contact is made deep and the transverse width thereof becomes narrow, a problem normally arises that the etching gas is hard to enter, the etching speed is lowered and the etching hardly proceeds in the worst case.

Figure 6:
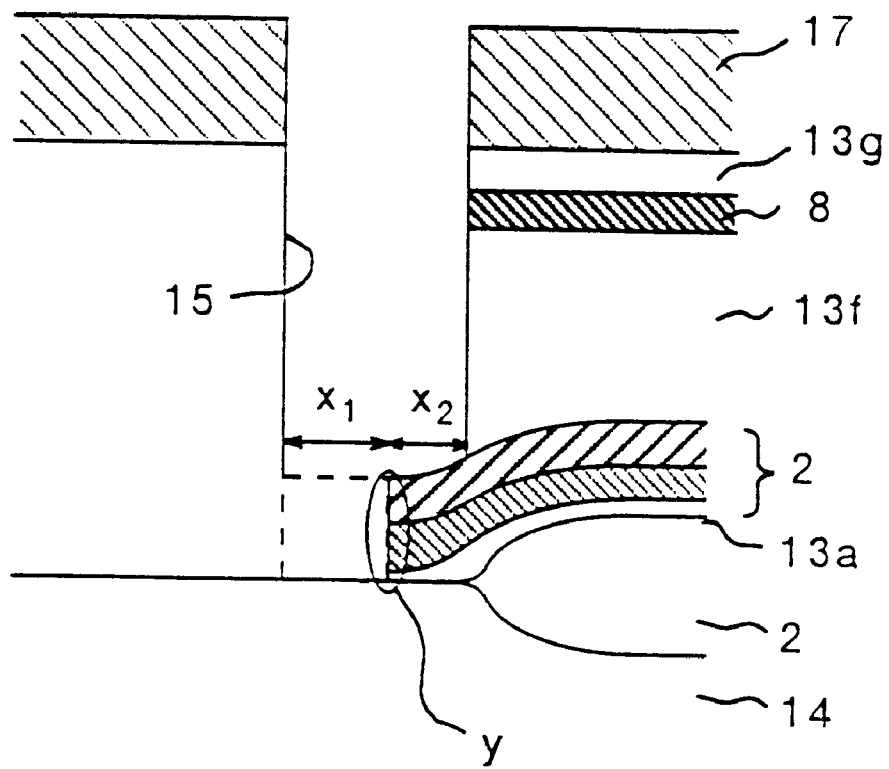
FIG. 6 is a sectional structural view showing the interlayer connection structure of the semiconductor device according to the fourth embodiment of the present invention.

FIG. 6 shows the state in which contact etching has been effected up to the first poly 2. The subsequent etching is effected on a region surrounded by a dotted line. However, since the contact is formed deep in the structure of the present invention as described above, there is a possibility that when the width X1 is small, etching will not proceed. However, once the contact is enlarged, the cell size is also enlarged. Therefore, the width X2 is set so as to be smaller than the width X1 to keep the size of the present contact to the same size as that of the conventional shared contact. Even if the width X2 is made small, the first poly 2 can be connected to the third poly 6 at a side wall Y of the first poly 2 shown in FIG. 6 in the worst case. Therefore, the width X1 is set so as to be greater than the width X2 in the shared contact according to the present embodiment (X1>X2). Thus, the shared contact of the present invention can be realized in the same size as the conventional one.

Fifth Embodiment

Figure 7:
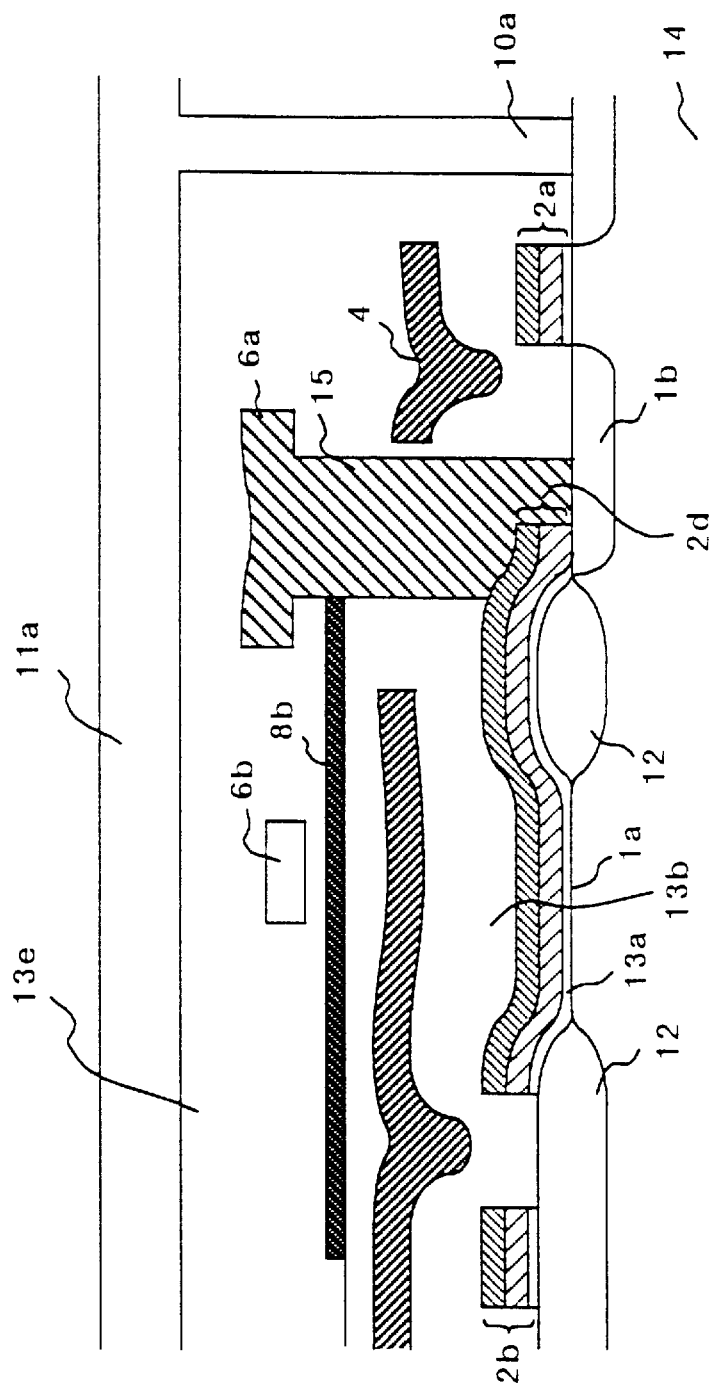
FIG. 7 is a sectional structural view illustrating a memory cell employed in a semiconductor device according to a fifth embodiment of the present invention.

FIG. 7 is a view showing the structure of a semiconductor device according to a still further embodiment of the present invention. The present drawing is a cross sectional view showing a shared contact structure of the present invention, which has been applied to a SRAM.

Among the structures described in the first through third embodiments, the structure according to the third embodiment is the most excellent for cell characteristics. FIG. 7 shows an example in which this structure has been applied to the SRAM.

In FIG. 7, the same reference numerals as those shown in FIGS. 1 through 6 respectively indicate the same or corresponding portions as those shown in FIGS. 1 through 6, so that a detailed description of the respective portions will be omitted. As seen from the drawing in the present embodiment, a connecting portion 16 extending from a third poly 6a electrically connects an active layer 1b, a first poly 2d and a second poly 8b to one another.

Figure 14:
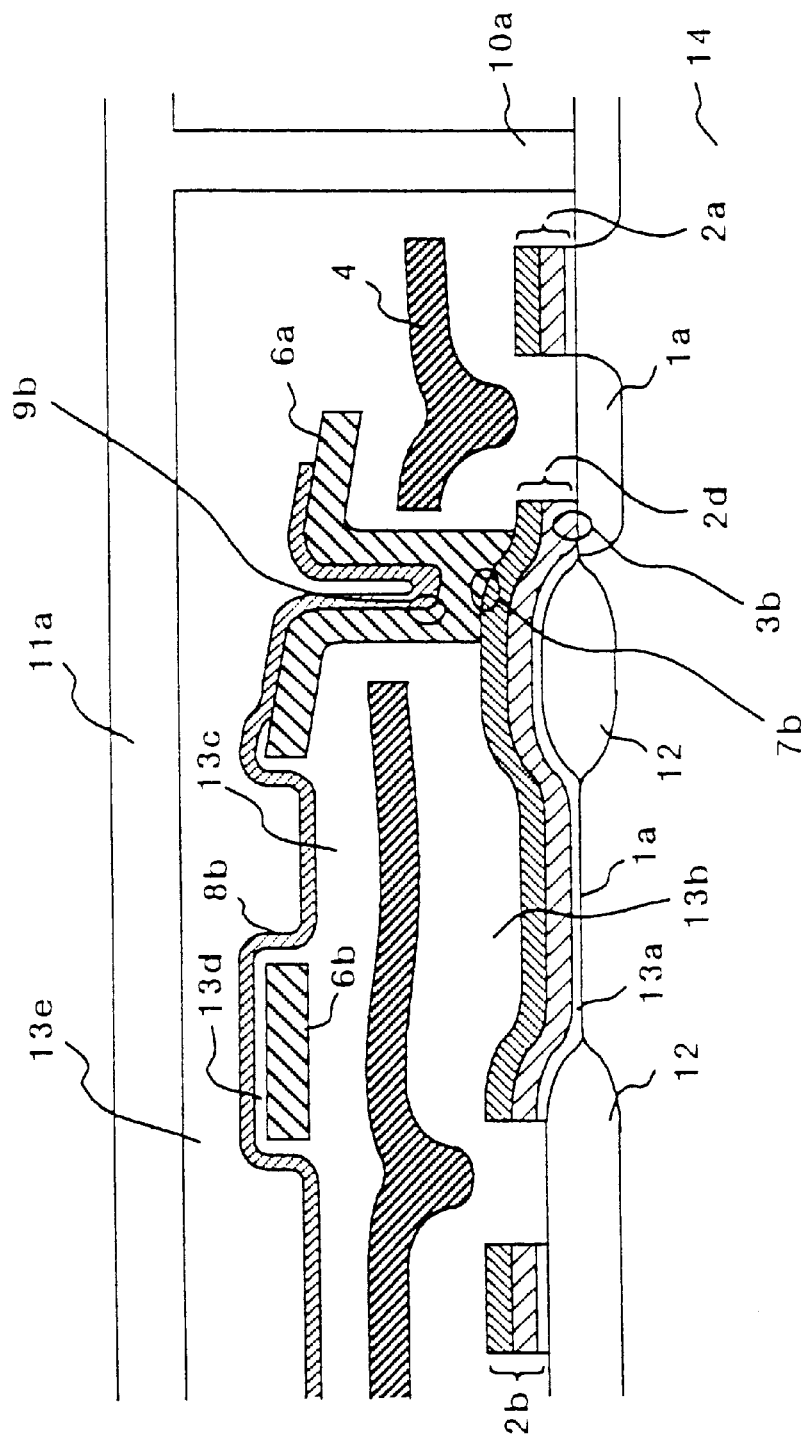
FIG. 14 is a sectional structural view of the memory cell employed in the conventional device.
Figure 15:
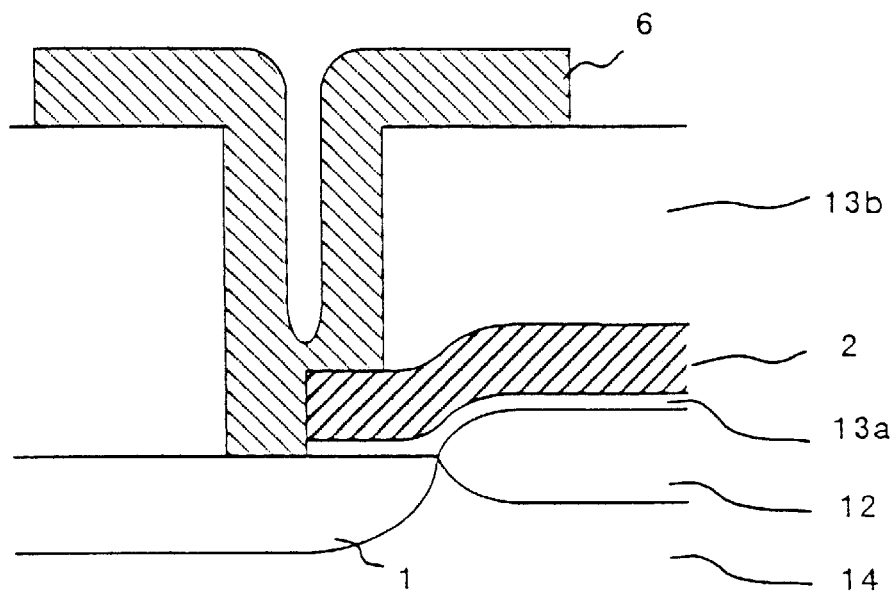
FIG. 15 is a sectional structural view showing a shared contact structure of the conventional device.

In the SRAM employed in the present embodiment, only the first poly 2 is formed as a gate electrode of a substrate transistor in a manner similar to the conventional example. The second poly 8 serves as a conductive film formed as a source/drain and channel layer of the TFT, and the third poly 6 serves as a conductive film formed as a gate electrode of the TFT. As compared with the case in which the conventional example needed to form the contact three times as described in FIG. 14, a process can be greatly simplified owing to such a structure.

Further, although the conventional TFT was of the bottom gate type, the present embodiment is of the top gate type excellent in performance. When the conventional top gate type TFT and the shared contact is combined into one, a problem of a PN junction arose. According to the present structure, a contact portion of the second poly 8b is set as P type, and the third poly 6a and the connecting portion 16 are set as N type. Thus, the N type active layer 1b and the connecting portion 16 of the third poly 6a are of the same N type conduction type, so that the contact does not cause a PN junction, and no drop in potential occurs. Since the second poly 8b and the third poly 6a form an electrical connection between P poly and N poly, the PN junction becomes a problem-free level.

Moreover, the thickness Tpj of the second poly 8 and the thickness Toi of the inter layer insulating film 13g are made thin to improve etching for the contact. TFT characteristics can be also improved owing to these thinned films. Namely, leakage current corresponding to an OFF current can be reduced owing to the thinning of the thickness Tpj of the second poly 8 serving as the source/drain and channel layer of the TFT. Further, since a gate oxide film of the TFT becomes thin by reducing the thickness Toi of the inter layer insulating film 13g, an improvement in ON current can be achieved.

As described above, the problem of the junction can be solved by providing the second poly 8 as the source/drain and channel layer of TFT and providing the third poly 6 as the gate electrode of TFF as described in the structure according to the present embodiment. Further, a high-performance top gate type TFT can be adopted, and the performance of the structure can be further improved in consideration of the thickness-to-thickness relationship. As described above, the present embodiment shows an example in which the performance of SRAM has been improved by a combination of the top gage type TFT and the direct contact structure.

Sixth Embodiment

Figure 8:
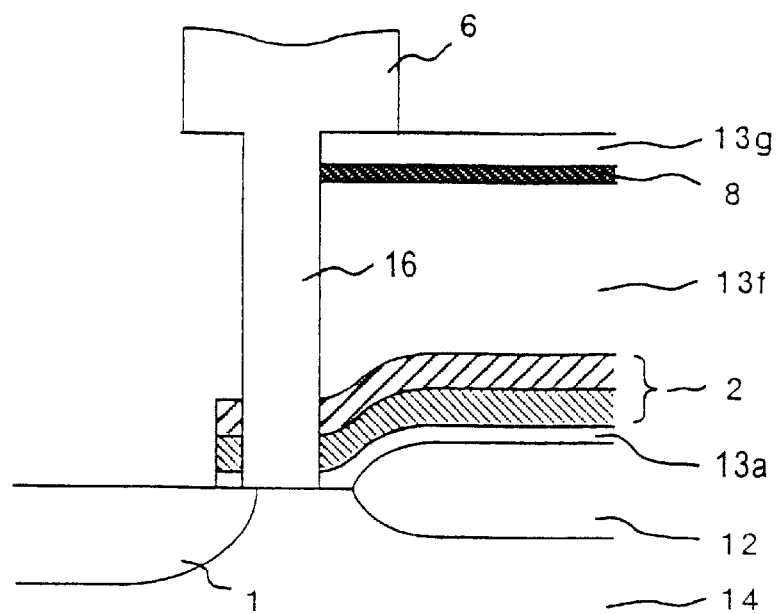
FIG. 8 is a sectional structural view showing an interlayer connection structure of a semiconductor device according to a sixth embodiment of the present invention.
Figure 9:
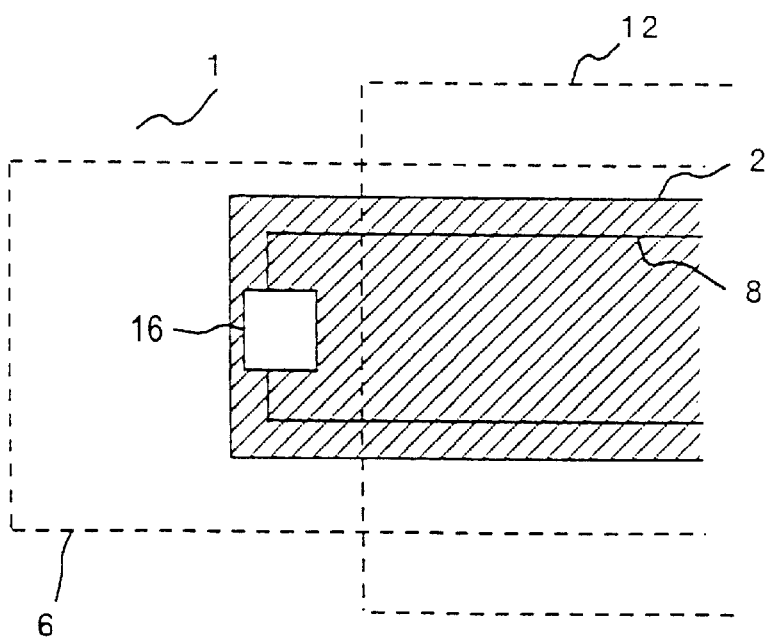
FIG. 9 is a plan structural view depicting the interlayer connection structure of the semiconductor device according to the sixth embodiment of the present invention.
Figure 10:
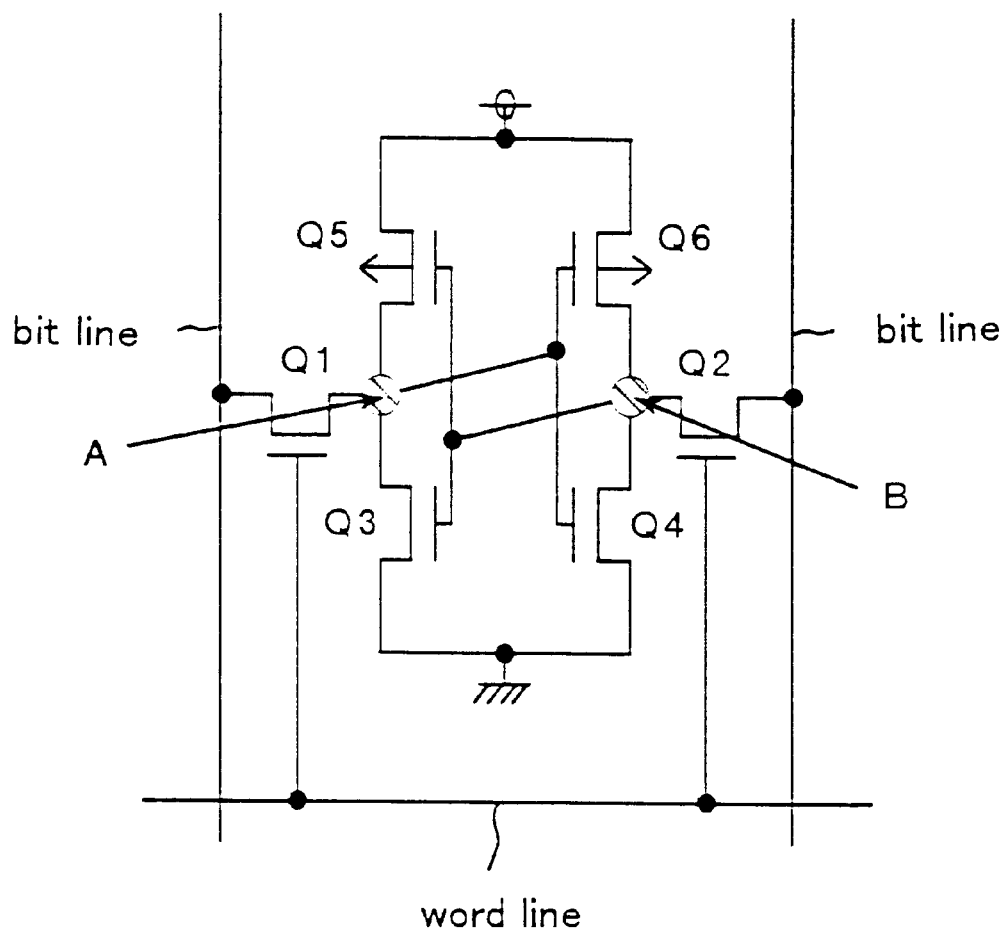
FIG. 10 is an equivalent circuit diagram showing a SRAM memory cell.
Figure 11:
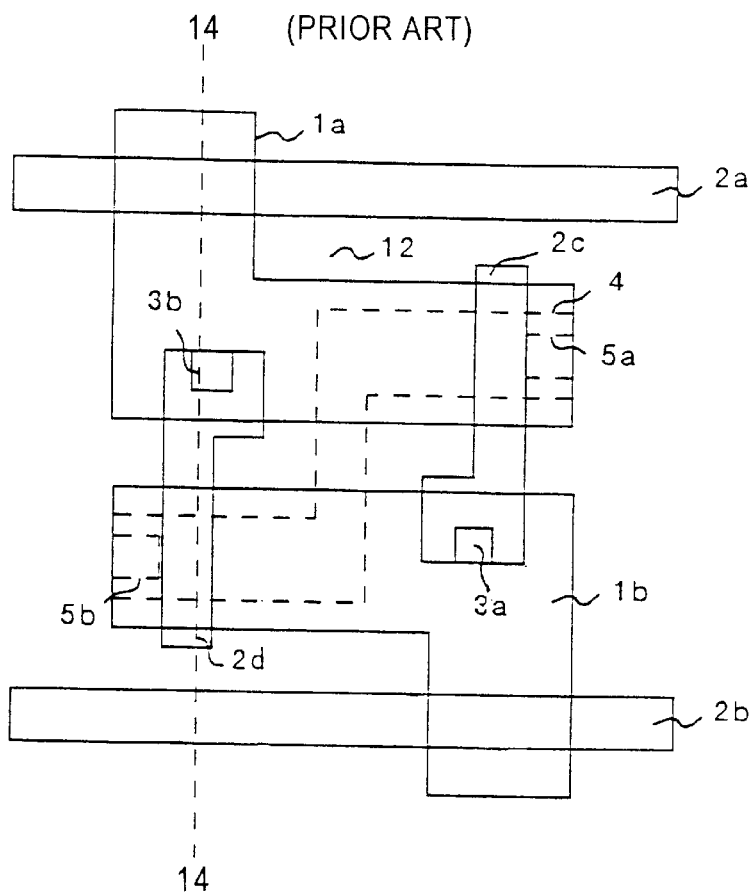
FIGS. 11 to 13 show a layout of a memory cell employed in a conventional device.
Figure 12:
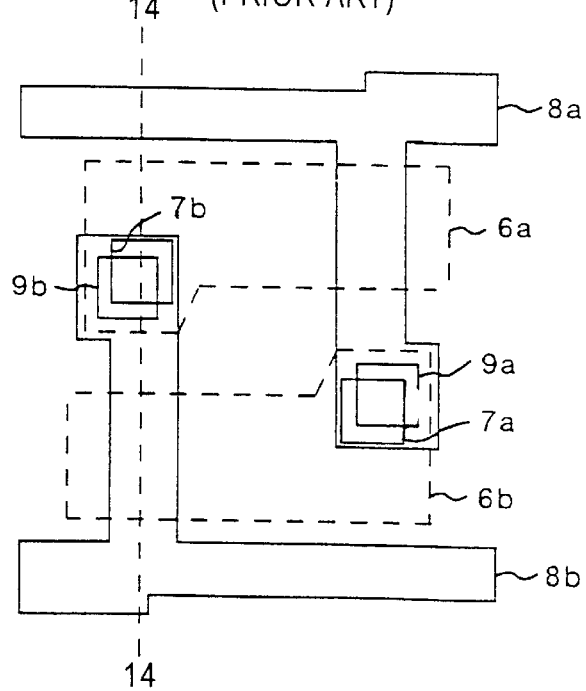
Figure 13:
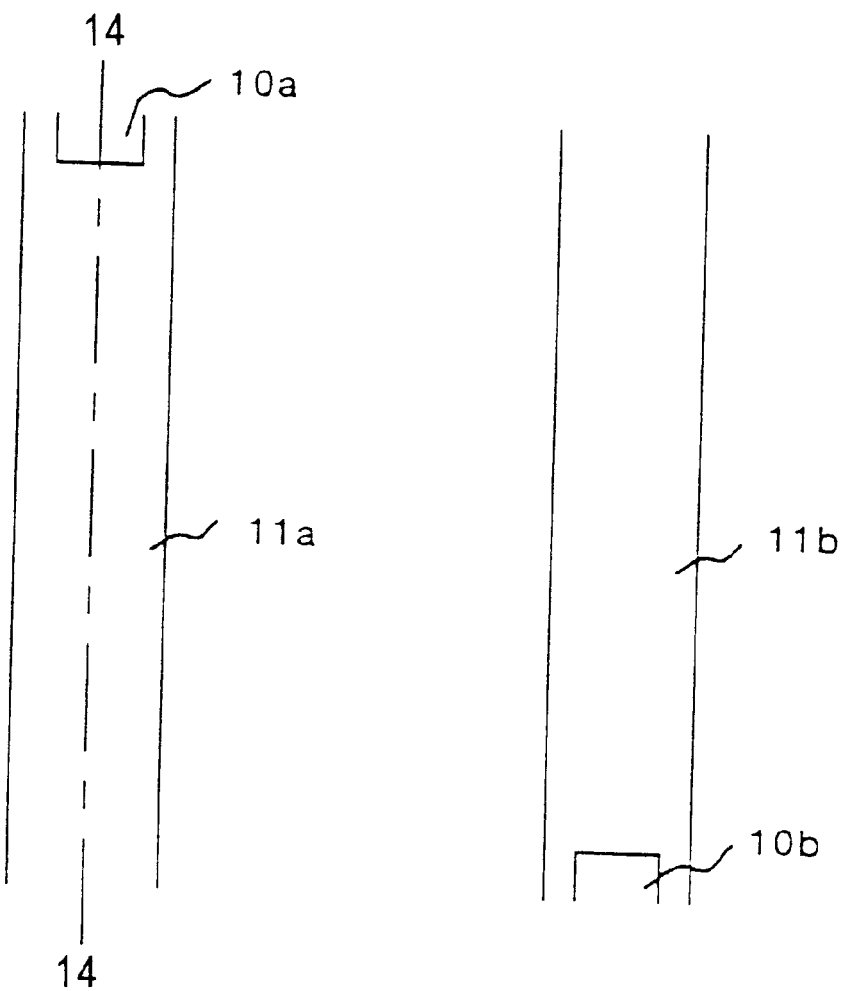

FIGS. 8 and 9 are views respectively showing a polycontact structure employed in a semiconductor device according to a still further embodiment of the present invention. FIG. 8 is a sectional structural view of the polycontact structure. FIG. 9 is a plan structural view of the polycontact structure. In FIGS. 8 and 9, the same reference numerals as those shown in FIGS. 1 through 7 respectively indicate the same or corresponding portions as shown in FIGS. 1 through 7, and the respective portions will not therefore be described in detail.

In the polycontact structure according to the present embodiment, a connecting portion 18 extending from a third poly 6 extends so as to cut out the leading end of a second poly 8. Further, the connecting portion 18 extends through a first poly 2 so as to reach a substrate 14 and an active layer 1. Namely, the polycontact structure according to the present embodiment is not a shared structure but a structure in which both end surfaces (side surfaces) of the first poly 2 and the second poly 8 are brought into contact with a connecting portion 16 of the third poly 6. Even in such a structure, electrical connections among three layers are established, and the structure can be formed by one polycontact mask.

Also to the structure according to the present embodiment can be applied are the structures of making the thickness of the second poly 8 thinner than that of the third poly 6 as shown in FIG. 1, or making the thickness of the second interlayer insulating film 13g thinner than that of the first interlayer insulating film 13f as shown in FIG. 3, or further making the thickness of the second poly 8 thinner than that of the third poly 6 and making the thickness of the first interlayer insulating film 13f thinner than that of the second interlayer insulating film 13g as shown in FIG. 4. Further, this structure can be applied to the SRAM as shown in FIG. 7. The same advantageous effect as described above can be obtained.

As has been described above in detail, according to the present invention, a first conductive film, a first insulating film, a second conductive film, a second insulating film, and a third conductive film are stacked on a semiconductor substrate. The thickness of the second conductive film is set so as to be thinner than that of the third conductive film. Further, a polycontact is formed extending from the third conductive film to the semiconductor substrate, the first conductive film and the second conductive film. Therefore, the number of masks can be reduced and the process steps can be simplified. Further, the etching process can be simplified.

In the present invention as well, the thickness of the second insulating film is thinner than that of the first insulating film and the polycontact is formed extending from the third conductive film to the semiconductor substrate, the first conducive film and the second conductive film. It is therefore possible to reduce the number of masks and simplify the process steps and etching process.

Further, in the present invention, the end of the first conductive film protrudes toward a columnar connecting portion, and the length of the protruded end is smaller than one-half the diameter of the columnar connecting portion. It is therefore possible to prevent the size of a polycontact from increasing but hold its size.

Furthermore, since the first conductive film is brought into contact with the columnar connecting portion at its end surface alone in the present invention, the size of the polycontact can be prevented from increasing and the size of the polycontact can be kept.

Still further, in the present invention, the first conductive film is formed as a gate electrode of a substrate transistor, the second conductive film is formed as a channel conductive film of a TFT transistor, and the third conductive film is formed as a gate electrode of the TFT transistor. It is therefore possible to improve TFT characteristics.

Still further, in the present invention, the semiconductor substrate has an N type active layer and the columnar connecting portion and a third conductive film brought into contact with the N type active layer are formed of N type polysilicon. Therefore, a problem of a junction at a direct contact does not arise and hence stable characteristics of a semiconductor device can be obtained.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film so as to reach said first conductive film and the semiconductor substrate, said columnar connecting portion being formed of polysilicon integral with and as a part of said third conductive film;

said second conductive film being brought into contact with said columnar connecting portion at its end surface and the thickness of said second conductive film being less than that of said third conductive film.

2. A semiconductor device as claimed in claim 1, wherein an end of said first conductive film extends toward said columnar connecting portion and the length of the extended end is equal to or less than one-half the diameter of said columnar connecting portion.

3. A semiconductor device as claimed in claim 1, wherein said first conductive film is brought into contact with said columnar connecting portion at its end surface.

4. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film so as to reach said first conductive film and said semiconductor substrate, said columnar connecting portion being formed of polysilicon integral with and as a part of said third conductive film;

said second conductive film being in contact with said columnar connecting portion at its end surface and the thickness of said second insulating film being less than that of said first insulating film, wherein the thickness of said second conductive film is formed so as to be less than that of said third conductive film.

5. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film so as to reach said first conductive film and the semiconductor substrate, said columnar connecting portion being formed of polysilicon integral with and as a part of said third conductive film;

said second conductive film being brought into contact with said columnar connecting portion at its end surface and the thickness of said second conductive film being less than that of said third conductive film.

wherein a third insulating film is formed between said semiconductor substrate and said first conductive film, said first conductive film is formed as a gate electrode of a substrate transistor, said second conductive film is formed as a channel conductive film of a TFT transistor and said third conductive film is formed as a gate electrode of said TFT transistor.

6. A semiconductor device as claimed in claim 5, wherein said semiconductor substrate has an N type active layer, and said third conductive film and said columnar connecting portion brought into contact with said N type active layer are formed of N type polysilicon.

7. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film, said columnar connecting portion being formed of polysilicon integral with and as a part of said third conductive film;

said second conductive film being brought into contact with said columnar connecting portion at its end surface and the thickness of said second conductive film being less than that of said third conductive film.

8. A semiconductor device as claimed in claim 7, wherein an end of said first conductive film extends toward said columnar connecting portion and the length of the extended end is equal to or less than one-half the diameter of said columnar connecting portion.

9. A semiconductor device as claimed in claim 7, wherein said first conductive film is brought into contact with said columnar connecting portion at its end surface.

10. A semiconductor device as claimed in claim 7, wherein the thickness of said second conductive film is equal to, or less than, the thickness of said third conductive film.

11. A semiconductor device as claimed in claim 7, wherein the thickness of said second insulating film is equal to, or less than, the thickness of said first insulating film.

12. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film so as to reach said first conductive film, said columnar connecting portion being formed of polysilicon integral with and as part of said third conductive film;

said second conductive film being in contact with said columnar connecting portion at its end surface and the thickness of said second insulating film being less than that of said first insulating film, wherein the thickness of said second conductive film is formed so as to be less than that of said third conductive film.

13. A semiconductor device as claimed in claim 12, wherein an end of said first conductive film extends toward said columnar portion and the length of the extended end is equal to or less than one-half the diameter of said columnar connecting portion.

14. A semiconductor device as claimed in claim 12, wherein said first conductive film is brought into contact with said columnar connecting portion at its end surface.

15. A semiconductor device as claimed in claim 12, wherein the thickness of said second conductive film is equal to, or less than, the thickness of said third conductive film.

16. A semiconductor device as claim in claim 12, wherein the thickness of said second insulating film is equal to, or less than, the thickness of said first insulating film.

17. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween, said third conductive film being formed of polysilicon; and a columnar connecting portion penetrating at least said second insulating film and said first insulating film from said third conductive film so as to reach said first conductive film, said columnar connecting portion being formed of polysilicon integral with and as a part of said third conductive film;

said second conductive film being brought into contact with said columnar connecting portion at its end surface and the thickness of said second insulating film being less than that of said third conductive film, wherein a third insulating film is formed between said semiconductor substrate and said first conductive film, said first conductive film is formed as a gate electrode of a substrate transistor, said second conductive film is formed as a channel conductive film of a TFT transistor and said third conductive film is formed as a gate electrode of said TFT transistor.

18. A semiconductor device as claimed in claim 17, wherein said semiconductor substrate has an N type active layer, and said third conductive film and said columnar connecting portion brought into contact with said first conductive film are formed of N type polysilicon.

19. A semiconductor device comprising:

a first conductive film formed on a semiconductor substrate;

a second conductive film formed on said first conductive film with a first insulating film interposed therebetween;

a third conductive film formed on said second conductive film with a second insulating film interposed therebetween; and a columnar connecting portion penetrating at least said second insulating film and said first insulating film from said third conductive film so as to reach said first conductive film, said columnar connecting portion being formed of polysilicon integral with and as a part of said third conductive film;

said second conductive film being in contact with said columnar connecting portion at its end surface and the thickness of said second insulating film being less than that of said first insulating film, wherein the thickness of said second conductive film is formed so as to be less than that of said third conductive film, and wherein a third insulating film is formed between said semiconductor substrate and said first conductive film, said first conductive film is formed as a gate electrode of a substrate transistor, said second conductive film is formed as a channel conductive film of a TFT transistor and said third conductive film is formed as a gate electrode of said TFT transistor.

20. A semiconductor device as claimed in claim 19, wherein said semiconductor substrate has an N type active layer, and said third conductive film sand said columnar connecting portion brought into contact with said first conductive film are formed of N type polysilicon.

* * * * *